United States Patent
Kim et al.

[11] Patent Number: 5,918,118
[45] Date of Patent: Jun. 29, 1999

[54] DUAL DEPOSITION METHODS FOR FORMING CONTACT METALLIZATIONS, CAPACITORS, AND MEMORY DEVICES

[75] Inventors: Jin-Won Kim, Seoul; Cheal-Seong Hwang; Sang-In Lee, both of Kyonggi-do, all of Rep. of Korea

[73] Assignee: Samsung Electronics Co., Ltd., Rep. of Korea

[21] Appl. No.: 08/931,821

[22] Filed: Sep. 16, 1997

[30] Foreign Application Priority Data

Jan. 22, 1997 [KR] Rep. of Korea .......... 97-1709

[51] Int. Cl.$^6$ .......... H01L 21/283; H01L 21/70
[52] U.S. Cl. .......... 438/238; 438/240; 438/396; 438/646; 438/650
[58] Field of Search .......... 438/240, 238, 438/396, 646, 650

[56] References Cited

U.S. PATENT DOCUMENTS

| | | | |
|---|---|---|---|
| 5,335,138 | 8/1994 | Sandhu et al. | 438/240 |
| 5,478,772 | 12/1995 | Fazan | 438/240 |
| 5,494,840 | 2/1996 | Ohmi | 438/253 |
| 5,504,041 | 4/1996 | Summerfelt | 438/240 |
| 5,565,703 | 10/1996 | Chang | 257/530 |
| 5,602,053 | 2/1997 | Zheng et al. | 438/600 |
| 5,618,746 | 4/1997 | Hwang | 438/3 |
| 5,633,781 | 5/1997 | Saenger et al. | 361/321.4 |
| 5,696,394 | 12/1997 | Jones, Jr. et al. | 257/298 |
| 5,712,759 | 1/1998 | Saenger et al. | 361/321.4 |
| 5,716,869 | 2/1998 | Hibino et al. | 438/632 |
| 5,851,917 | 12/1998 | Lee | 438/646 |

OTHER PUBLICATIONS

Sorab K. Ghandhi "VLSI Fabrication Principles. Silicon and Gallium Arsenide" p. 597, Jul. 31, 1994.

*Primary Examiner*—Peter Toby Brown
*Assistant Examiner*—Maria Guerrero
*Attorney, Agent, or Firm*—Myers Bigel Sibley & Sajovec

[57] ABSTRACT

A method for forming a dynamic random access memory device includes the step of forming a memory cell access transistor on a semiconductor substrate wherein the memory cell access transistor includes a source/drain region at a surface of the semiconductor substrate. An insulating layer is formed on the semiconductor substrate and on the memory cell access transistor wherein the insulating layer has a contact hole therein exposing a portion of the source/drain region of the substrate. A first conductive layer is chemical vapor deposited on the exposed portion of the source/drain region of the substrate, and a second conductive layer is physical vapor deposited on the first conductive layer opposite the substrate. A dielectric layer is formed on the second conductive layer opposite the substrate, and a third conductive layer is formed on the dielectric layer opposite the substrate.

49 Claims, 4 Drawing Sheets

DUAL DEPOSITION METHODS FOR FORMING CONTACT METALLIZATIONS, CAPACITORS, AND MEMORY DEVICES

FIELD OF THE INVENTION

The present invention relates to the field of semiconductor devices and more particularly to the field of contact metallizations for semiconductor devices.

BACKGROUND OF THE INVENTION

A dynamic random access memory (DRAM) device includes an array of memory cells wherein each memory cell includes a memory cell access transistor and a memory cell (information storage) capacitor. In general, a memory cell capacitor requires a storage capacitance of at least about 30 fF to reduce soft errors which may result from α-particles. As the integration densities of DRAMs increase, however, reduced space is available for each memory cell capacitor.

As will be understood by those having skill in the art, the capacitance of a memory cell capacitor can be determined using the following formula:

$$C = \epsilon_0 \epsilon A / d$$

In particular, C represents the storage capacitance for the capacitor, $\epsilon_0$ represents the dielectric constant in a vacuum, $\epsilon$ represents the dielectric constant of the capacitor dielectric layer, A represents the effective area of the capacitor, and d represents the thickness of the dielectric layer. Accordingly, a memory cell capacitance can be increased by increasing a dielectric constant for the dielectric layer, by increasing an effective area for the capacitor, and by decreasing a thickness of the dielectric layer.

Reductions in the thickness of the dielectric layer may be limited when fabricating highly integrated memory devices. In particular, when a dielectric layer such as an NO layer or a $Ta_2O_5$ layer having a thickness of less than approximately 100 Angstroms is used, the reliability of the dielectric layer may be reduced as a result of Fowler-Nordheim currents.

Three-dimensional capacitor structures have been developed to increase the effective area of memory cell capacitors. The steps used to fabricate these three-dimensional structures, however, may be complicated and costly. For example, three-dimensional structures developed for memory cell capacitors include the stack type capacitor structure, the trench type capacitor structure, the fin type capacitor structure, and the cylinder type capacitor structure. These structures have been used for 4 MB and 16 MB DRAMs, but these capacitor structures may not be suitable for use in 64 MB and 256 MB DRAMs. In particular, the scaling down of trench type capacitor structures may result in leakage current between trenches. Moreover, stack type capacitor structures, fin type capacitor structures, and cylinder type capacitor structures may result in severely uneven surfaces when providing relatively high storage capacitances. These uneven surfaces may adversely affect subsequent photolithography and etch steps.

Dielectric layers for memory cell capacitors have been produced using materials having dielectric constants that are high relative to the dielectric constant of a NO dielectric layer. For example, $Y_2O_3$, $Ta_2O_5$, $TiO_2$ have been used to provide dielectric layers for memory cell capacitors. In addition, ferroelectric materials such as PZT(Pb(Zr, Ti)$O_3$), and BST(BaSrTi) have also been used. Ferroelectric materials have spontaneous polarizations, and ferroelectric materials can have a dielectric constant in the range of 100 to 1,000. Accordingly, when such a ferroelectric material is used to create a dielectric layer for a memory cell capacitor having a predetermined effective area, the dielectric layer can have a thickness of several hundreds of Angstroms while providing the same capacitance as a memory cell capacitor with the same predetermined effective area having a dielectric oxide layer with a thickness of less than 10 Angstroms.

In particular, BST can retain a relatively high dielectric constant at a relatively high frequency when compared to PZT. In addition, BST can be changed to a normal dielectric substance according to the ratio Bs/Sr thereby reducing fatigue and aging. BST has thus been used to provide the dielectric layer for memory cell capacitors.

Ferroelectric layers can be formed on semiconductor devices using sputtering steps, metal-organic chemical vapor deposition (MOCVD) steps, spin coating steps, and aerosol steps as well as other deposition steps known to those having skill in the art. Moreover, BST layers can be formed using these and other steps. In particular, sputtering steps may be preferred when depositing ferroelectric layers because of its repeatability and relative simplicity. Because a dielectric layer of BST is preferably not deposited directly on a polysilicon electrode, however, improved electrodes may be required when fabricating a DRAM memory cell capacitor including a BST dielectric layer. In particular, when a BST layer is sputtered on a polysilicon electrode, the surface of the polysilicon electrode may be partially oxidized in an oxygen ambient, and a $SiO_2$ layer may be formed thereon. This oxide layer may thus reduce the dielectric constant of the BST layer thereby reducing the capacitance for the memory cell capacitor.

Accordingly, the memory cell capacitor electrode may include a conductive plug, a diffusion barrier layer, and a platinum layer instead of a polysilicon electrode. Accordingly, the BST dielectric layer can be formed reducing the disadvantages associated with the oxidation of the polycrystalline capacitor electrode.

Sputter deposited BST layers, however, may have poor step coverage, and it may thus be difficult to deposit a BST layer on the lateral surfaces of the capacitor electrode. Accordingly, memory cell capacitors including BST dielectric layers may be prone to leakage currents in excess of 100nA/cm$^2$ flowing through the portions of the BST layer deposited on the lateral surfaces of the capacitor electrode. Moreover, sputtering steps used to deposit BST layers may be carried out at relatively high temperatures. Accordingly, oxygen may diffuse through the lateral surfaces of the capacitor electrode including the conductive plug, the diffusion barrier layer, and the platinum layer. The diffusion barrier layer may thus be oxidized thus making it difficult to fabricate a capacitor including a BST dielectric layer.

Techniques for protecting the metal barrier layer have thus been developed wherein the lateral surfaces of the capacitor electrode are enclosed by a $SiO_2$ layer or by another insulating layer such as $Si_3N_4$. In particular, a method for protecting the metal barrier layer will now be discussed with reference to FIGS. 1A to 1E. As shown in FIG. 1A, an insulating layer 12 is formed on a semiconductor substrate 10. A photoresist mask exposes portions of the insulating layer 12 which are then etched to form contact holes through the insulating layer 12 exposing portions of the substrate 10.

The photoresist mask is then removed, and exposed portions of the substrate 10 are covered with a first conductive layer 14a as shown in FIG. 1B. In particular, the conductive layer 14a is formed on exposed portions of the substrate 10 and on the insulating layer 12 opposite the substrate 10. The first conductive layer 14a can be a layer of polycrystalline silicon (polysilicon).

The first conductive layer 14a is then etched back to provide the conductive plugs 14b in the contact holes through the insulating layer 12, as shown in FIG. 1C. A diffusion barrier layer 16 is then deposited on the conductive plugs 14b and on the insulating layer 12 as shown in FIG. 1D. A second conductive layer 18 is then deposited on the diffusion barrier layer 16, and the second conductive layer 18 can be a layer of platinum (Pt). A photoresist mask is then formed on the second conductive layer 18, and this photoresist mask is used to pattern the diffusion barrier layer 16 and the second conductive layer 18 to provide a capacitor electrode (storage node electrode), as shown in FIG. 1E. The photoresist mask is then removed. Accordingly, the first capacitor electrode 19 includes the conductive plugs 14b, the diffusion barrier layer 16, and the Pt layer 18.

A second insulating layer such as a layer of $SiO_2$ or $Si_3N_4$ is then deposited on the insulating layer 12 and on the capacitor electrode 19 to reduce oxidation of the diffusion barrier layer 16. The insulating layer is then subjected to an anisotropic dry etching step or a chemical mechanical polishing (CMP) step so that lateral spacers 20 of an insulating material are formed on the lateral surfaces of the capacitor electrode 19. Accordingly, the lateral surfaces of the capacitor electrode are passivated by the spacers 20. The metal barrier layer 16 can thus be protected from an oxidation during the subsequent sputter deposition of the BST layer.

A BST layer is then sputter deposited on the capacitor electrode 19, on the insulating layer 12, and on the lateral spacers 20. A third conductive layer is then deposited on the BST layer opposite the capacitor electrode 19 to provide a second capacitor electrode (plate node electrode) thereby providing a memory cell capacitor for a DRAM. In particular, a Pt layer can be used to provide the third conductive layer. The fabrication of the lateral spacers, however, may increase the complexity and cost of the manufacturer of a memory device including the capacitor discussed above.

Another method for protecting a diffusion barrier layer while forming a capacitor electrode includes the following steps. An insulating layer is formed on the semiconductor substrate, and contact holes are formed in the insulating layer exposing portions of the semiconductor substrate. The diffusion barrier layer is formed on the exposed surface portions of the substrate in the contact holes. A platinum electrode layer is then deposited on the surface of the diffusion barrier layer in the contact holes and on the surface of the insulating layer. Accordingly, the oxygen diffusion distance into the top and lateral surfaces of the Pt layer is increased, and it is thus possible to protect the diffusion barrier layer from oxidation. The Pt layer can be formed using a chemical vapor deposition step, or by a reflowing step carried out by a predetermined temperature after deposition of the Pt layer.

Chemical vapor deposition steps, however, are not generally used to form Pt layers when forming capacitors for semiconductor devices using mass production techniques. Furthermore, Pt electrodes formed by chemical vapor deposition may have relatively low purity and poor surface characteristics. The properties of capacitors including Pt layers formed by chemical vapor deposition may thus be relatively poor thereby reducing the performance of semiconductor devices including these capacitors. Accordingly, there continues to exist a need in the art for improved methods for forming capacitor electrodes.

SUMMARY OF THE INVENTION

It is therefore an object of the present invention to provide improved methods for forming contact metallizations, capacitors, and memory devices.

It is another object of the present invention to provide improved methods for making electrical contacts through contact holes of semiconductor devices having relatively high aspect ratios.

These and other objects are provided according to the present invention by methods including the steps of forming an insulating layer on a semiconductor substrate wherein the insulating layer has a contact hole therein exposing a portion of the substrate. A first conductive layer is formed on the exposed portion of the substrate by chemical vapor deposition, and a second conductive layer is formed on the first conductive layer opposite the substrate by physical vapor deposition. The use of the chemical vapor deposition step in combination with the physical vapor deposition step thus provides improved step coverage over the insulating layer and into the contact hole. Moreover, by performing a reflow step wherein the first and second conductive layers are reflowed, the surface characteristics of the first and second conductive layers can be improved thereby improving the quality of the electrical contact through the insulating layer.

In particular, the first and second layers can include platinum. Moreover, the step of forming the first conductive layer can include depositing the first conductive layer by chemical vapor deposition in an argon gas ambient including approximately 10% oxygen at a temperature in the range of 350° C. to 400° C. and at a pressure of approximately 1 torr. The step of forming the second conductive layer can include depositing the second conductive layer by physical vapor deposition in an argon gas ambient at a temperature in the range of 20° C. to 400° C. and at a pressure in the range of 1 mtorr to 10 mtorr.

Alternately, each of the first and second conductive layers can be a layer of a platinum group metal or an oxide thereof. The platinum group metal can include a material such as Pt, Ru, Rh, Ir, or Os.

In addition, the first and second conductive layers can be reflowed using a thermal treatment. The use of the reflow step allows the formation of an electrode having superior surface characteristics. In particular, the combination of the chemical vapor deposition step followed by the physical vapor deposition step and the reflow step provides improved step coverage and surface characteristics for an electrode thus formed. The step of reflowing the first and second conductive layers can be performed in an $N_2$ ambient and at a temperature of greater than approximately 750° C.

Moreover, the step of forming the first conductive layer can be preceded by the step of forming a diffusion barrier layer on the exposed portion of the substrate. Accordingly, oxidation of the diffusion barrier layer can be reduced during the subsequent deposition of a ferroelectric layer. In particular, the diffusion barrier layer can be a layer of a material such as a silicide, or a nitride. Preferably, the diffusion barrier includes TiSiN, or TiN. In addition, the step of forming the diffusion barrier layer can be preceded by the step of forming a layer of polycrystalline silicon or tungsten on the exposed portion of the semiconductor substrate.

The electrode formed according to the steps of the present invention can thus be used in the formation of a capacitor for a semiconductor device. Accordingly, a dielectric layer can be formed on the second conductive layer opposite the substrate, and a third conductive layer can be formed on the dielectric layer opposite the substrate. Moreover, the dielectric material can be a ferroelectric material such as BST, PZT, PLZT, or STO. Accordingly, a relatively high capacitance can be provided, and oxidation of the diffusion barrier layer when forming the ferroelectric layer can be reduced.

Furthermore, the capacitor formed according to the present invention can be used as a memory cell capacitor for a dynamic random access memory device. The memory cell capacitor can thus have a relatively high capacitance while occupying a relatively small surface area thereby facilitating higher levels of integration density.

DETAILED DESCRIPTION OF THE PREFERRED EMBODIMENTS

Figure 1A:
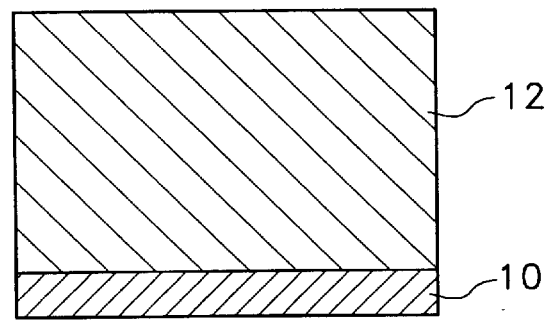
FIGS. 1A to 1E are cross sectional views illustrating steps of a method for forming capacitor electrodes according to the prior art.
Figure 1B:
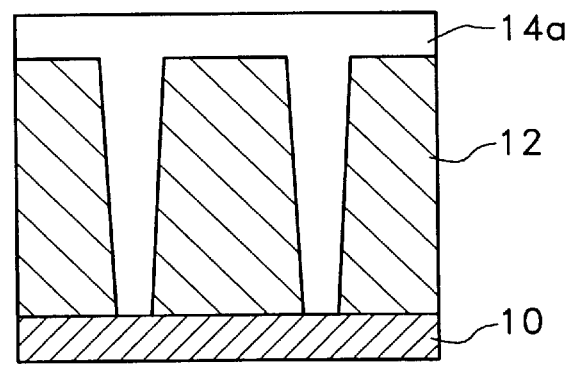
Figure 1C:
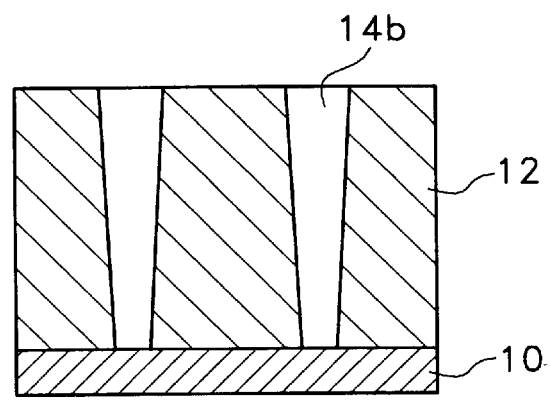
Figure 1D:
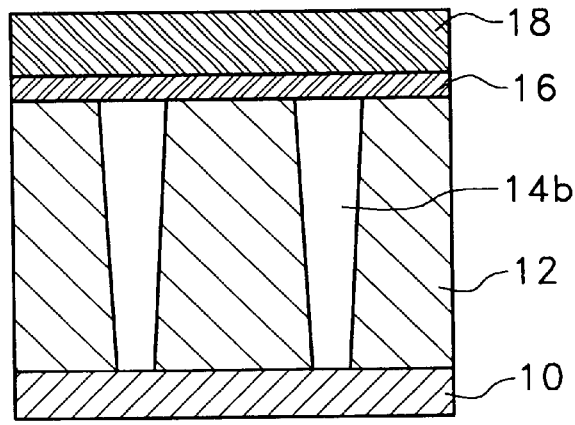
Figure 1E:
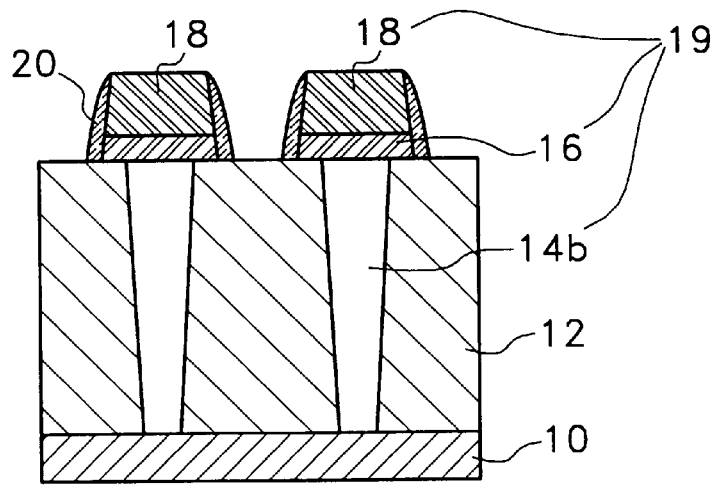

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout. It will also be understood that when a layer is referred to as being "on" another layer or substrate, it can be directly on the other layer or substrate, or intervening layers may also be present.

The present invention provides a method for increasing the capacitance of a memory cell capacitor of a dynamic random access memory (DRAM) device. In particular, a diffusion barrier layer of a capacitor electrode is protected from oxidation during the deposition of a ferroelectric dielectric layer such as BST, PZT, PLZT, and STO. The reliability of the memory device thus formed can thus be enhanced.

Figure 2A:
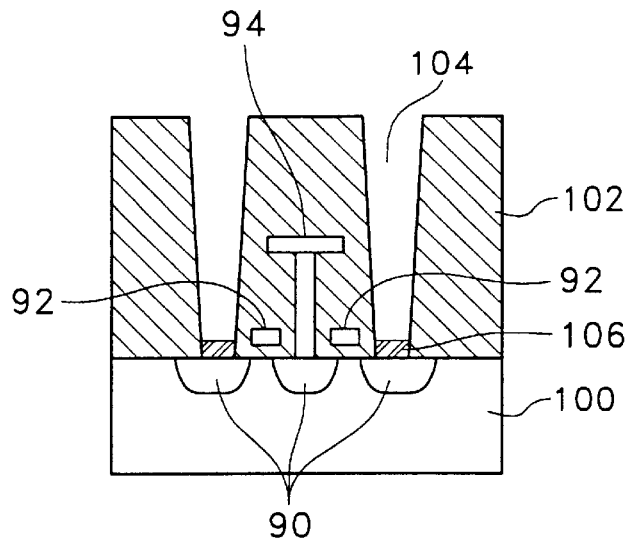
FIGS. 2A to 2F are cross sectional views illustrating steps of a method for forming dynamic random access memory (DRAM) device according to the present invention.

As shown in FIG. 2A, a pair of memory cell access transistors are formed on the semiconductor substrate 100. In particular, each memory cell access transistor includes a channel region in the substrate between two spaced apart source/drain regions 90. As shown, the two memory cell access transistors share a common source/drain region 90 which is electrically connected to the bit line 94. In addition, each memory cell access transistor includes a gate electrode 92 adjacent the channel region. An insulating layer 102 is then deposited on the semiconductor substrate 100, the memory cell access transistors, and the bit line 94, and a photoresist mask is formed on the insulating layer 102 exposing portions of the insulating layer which are etched to define contact holes in the insulating layer 102. As shown, each of the contact holes 104 exposes a respective source/drain region 90 for a respective memory cell access transistor. The photoresist mask is then removed, and a diffusion barrier layer 106 is formed on the exposed portions of the source/drain regions 90. In particular, the diffusion barrier layer 106 can be a silicide layer or a nitride layer. Preferably, the diffusion barrier layer includes a TiSiN layer, or a TiN layer.

Figure 2B:
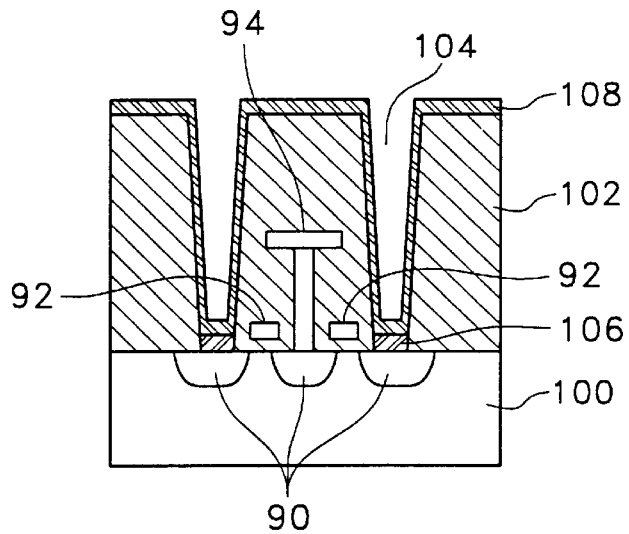
Figure 2C:
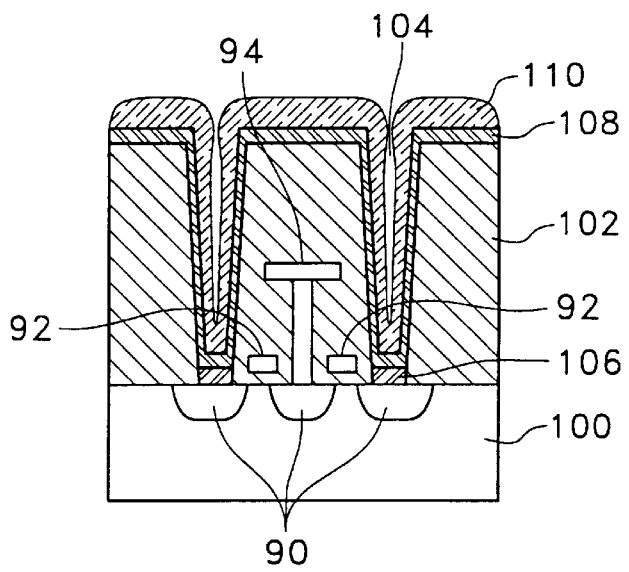

A first conductive layer 108 is then deposited on the diffusion barrier layer 106 in the contact hole 104 and on the insulating layer 102 using a chemical vapor deposition (CVD) step as shown in FIG. 2B. In particular, a CVD step is used to provide relatively good step coverage over the insulating layer 102 and the contact hole 104 therein. This CVD deposition can be performed in a reaction chamber with an Ar gas ambient including approximately 10% oxygen at a temperature in the range of 350° C. to 400° C. and at a pressure of approximately 1 torr. Moreover, the first conductive layer 108 can be a platinum layer, or a layer of a metal in the platinum group such as Ru, Rh, Ir, or Os. Alternately, the first conductive layer 108 can be a layer of an oxide of one of the above mentioned metals.

A second conductive layer 110 is then formed on the first conductive layer 108 using a physical vapor deposition (PVD) step such as a sputter deposition step. The second conductive layer 110 can be deposited in a reaction chamber with an Ar gas ambient at a temperature in the range of 20° C. to 400° C. and at a pressure in the range of 1 mtorr to 10 mtorr. The second conductive layer can be a layer of platinum group metal such as Pt, Ru, Rh, Ir, or Os. Alternately, a layer of an oxide of a platinum group metal can be used.

Figure 2D:
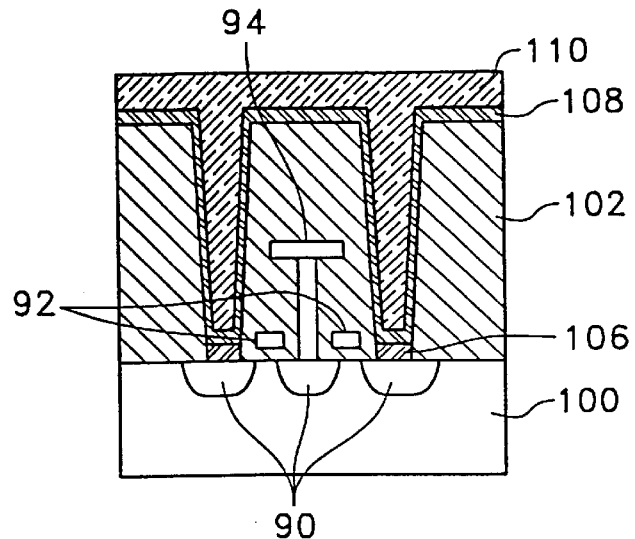

The first and second conductive layers 108 and 110 can then be made to reflow to fill the contact hole 104 as shown in FIG. 2D. In particular, the first and second conductive layers can be caused to reflow by heating the conductive layers at a temperature of approximately 750° C. in an $N_2$ ambient. By forming the first and second conductive layers 108 and 110 from a common electrode material, the reflow step can be more easily carried out because the reflow is dependent on the underlying layer.

The use of the physical vapor deposition step together with the reflow step allow for a relatively fast deposition and provide relatively high quality surface characteristics for the resulting structure when compared with similar structures using only a chemical vapor deposition step. Accordingly, the combination of the chemical vapor deposition, the physical vapor deposition, and the reflow provides superior characteristics for the conductive layers thus formed. The use of a single chemical vapor deposition step, however, may provide a relatively poor surface characteristics thereby reducing the performance of the capacitor including the layer and reducing the performance of the semiconductor device including the capacitor.

Figure 2E:
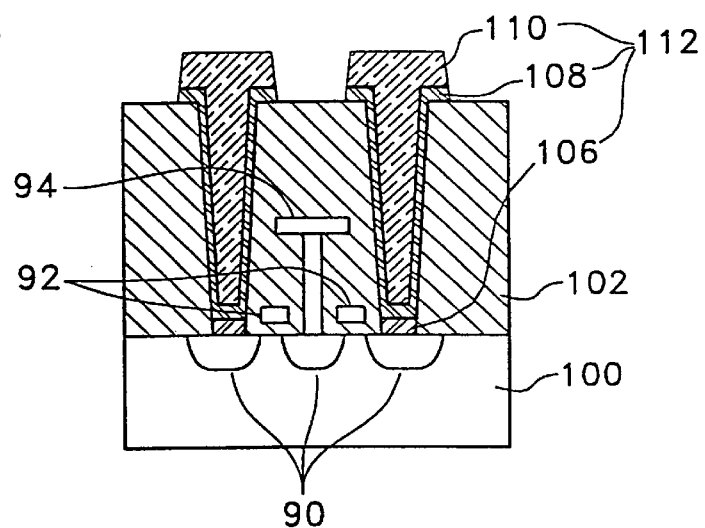

After the reflow step, a photoresist mask is formed on the second conductive layer 110 exposing portions thereof. The exposed portions of the second conductive layer 110 and the first conductive layer 108 are then etched thereby forming the first capacitor electrodes 112 as shown in FIG. 2E. In particular, each of the first capacitor electrodes 112 includes a diffusion barrier layer 106, a reflowed first conductive layer 108, and a reflowed second conductive layer 110. Furthermore, each of the first capacitor electrodes 112 defines an island on the insulating layer 102 which is connected to a respective source/drain region 90 through the contact hole 104. The first capacitor electrode 112 thus provides a storage node electrode for the capacitor being fabricated. The photoresist mask is then removed.

The first capacitor electrode 112 includes a diffusion barrier layer 106 which is formed on the contact hole. Accordingly, when a ferroelectric material is deposited by a sputtering step to form the dielectric layer for the capacitor, the oxygen diffusion distance into the top and lateral surfaces of the reflowed first conductive layer 108 and the reflowed second conductive layer 110 is increased. Accordingly, it is possible to protect the barrier layer 106 from oxidation during the sputter deposition of the ferroelectric layer.

Figure 2F:
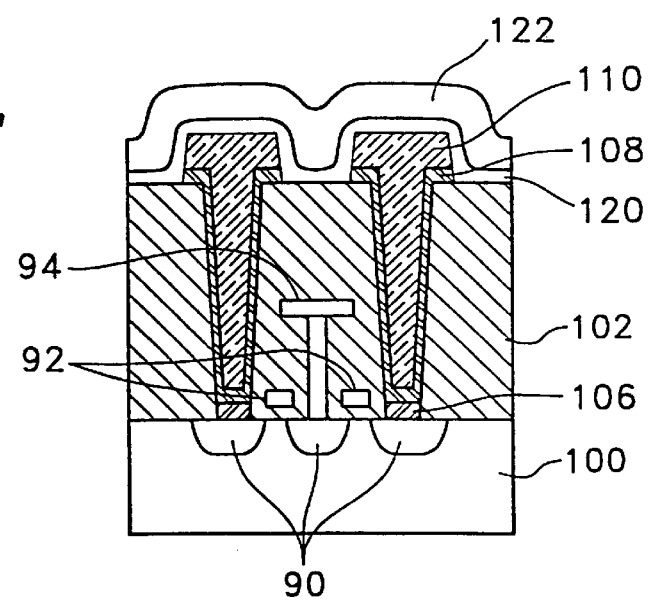

A ferroelectric dielectric layer 120 is then formed on the insulating layer 102 and on the first capacitor electrode 112 using a sputter deposition step, and a second capacitor (plate node) electrode 122 is formed on the dielectric layer as shown in FIG. 2F. In particular, the dielectric layer can be a layer of a ferroelectric material such as BST, PZT, PLZT, or STO. Moreover, the second capacitor electrode can be a layer of a platinum group metal such as Pt, Ru, Rh, Ir, or Os. Alternately, the second capacitor electrode can be formed from a layer of a platinum group metal oxide.

In addition, the step of forming the diffusion barrier layer 106 can be preceded by partially filling the contact hole 104 with a conductive layer of polycrystalline silicon or tungsten. In other words, a layer of polycrystalline silicon or tungsten is deposited on the exposed portions of the source/drain regions in the contact hole 104. Accordingly, the first capacitor (storage node) electrode includes a conductive layer of polycrystalline silicon or tungsten, a diffusion barrier layer, a reflowed first conductive layer, and a reflowed second conductive layer.

In the event that a layer of tungsten is deposited on the exposed portion of the source/drain region, the step of depositing the diffusion barrier layer 106 can be skipped because tungsten does not melt into a solid solution with platinum or platinum alloys. Accordingly, the first capacitor electrode will include a conductive layer of tungsten, a reflowed first conductive layer, and a reflowed second conductive layer when the step of depositing the diffusion barrier layer is omitted.

According to the methods of the present invention, a first conductive layer is deposited using a chemical vapor deposition step, and a second conductive layer is deposited using a physical vapor deposition step. The two conductive layers are then reflowed thereby providing relatively high quality surface characteristics for the conductive layers. These methods can thus be used to provide improved storage electrodes for memory cell capacitors. Although the first and second conductive layers are preferably layers of the same material, they can be layers of different materials as well. These methods can also be applied to the general fabrication of semiconductor devices wherein contact holes having a relatively high aspect ratio are filled with a conductive material. In other words, the methods of the present invention can be used to provide improved contact metallization for highly integrated semiconductor devices.

The methods of the present invention thus facilitate the formation of electrical contacts through contact holes having relatively high aspect ratios in highly integrated semiconductor devices. Because a diffusion barrier layer for the electrode is formed in the contact holes, oxidation of the diffusion barrier layer can be reduced when depositing a layer of a ferroelectric material. Accordingly, the contact metallization method of the present invention allows the fabrication of memory cell capacitors for DRAM devices having improved characteristics thereby increasing the reliability of a semiconductor device thus formed.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method for forming a dynamic random access memory device, said method comprising the steps of:

forming a memory cell access transistor on a semiconductor substrate wherein said memory cell access transistor includes a source/drain region at a surface of said semiconductor substrate;

forming an insulating layer on said semiconductor substrate and on said memory cell access transistor wherein said insulating layer has a contact hole therein exposing a portion of said source/drain region of said substrate;

chemical vapor depositing a first conductive layer on said exposed portion of said source/drain region of said substrate inside said contact hole, on sidewalls of said contact hole, and on a portion of said insulating layer adjacent said contact hole opposite said substrate;

physical vapor depositing a second conductive layer directly on said first conductive layer opposite said exposed portion of said source/drain region of said substrate and on said first conductive layer opposite said portions of said insulating layer adjacent said contact hole;

forming a dielectric layer on said second conductive layer opposite said substrate; and forming a third conductive layer on said dielectric layer opposite said substrate.

2. A method for forming a dynamic random access memory device, said method comprising the steps of:

forming a memory cell access transistor on a semiconductor substrate wherein said memory cell access transistor includes a source/drain region at a surface of said semiconductor substrate;

forming an insulating layer on said semiconductor substrate and on said memory cell access transistor wherein said insulating layer has a contact hole therein exposing a portion of said source/drain region of said substrate;

chemical vapor depositing a first conductive layer on said exposed portion of said source/drain region of said substrate;

physical vapor depositing a second conductive layer directly on said first conductive layer opposite said substrate with no intervening layers between said first and second conductive layers;

forming a dielectric layer on said second conductive layer opposite said substrate; and forming a third conductive layer on said dielectric layer opposite said substrate;

wherein each of said first and second conductive layers comprises a platinum group metal or an oxide thereof.

3. A method according to claim 2 wherein each of said first and second conductive layers comprises platinum.

4. A method according to claim 3 wherein said step of chemical vapor depositing said first conductive layer comprises depositing said first conductive layer by chemical vapor deposition in an Ar gas ambient including approximately 10% oxygen at a temperature in the range of 350° C. to 400° C. and at a pressure of approximately 1 torr.

5. A method according to claim 2 wherein said step of physical vapor depositing said second conductive layer comprises depositing said second conductive layer by physical vapor deposition in an Ar gas ambient at a temperature in the range of 20° C. to 400° C. and at a pressure in the range of 1 mtorr to 10 mtorr.

6. A method according to claim 2 wherein said platinum group metal includes a metal chosen from the group consisting of Pt, Ru, Rh, Ir, and Os.

7. A method according to claim 1 further comprising the step of reflowing said first and second conductive layers.

8. A method according to claim 7 wherein said step of reflowing said first and second conductive layers is performed in an $N_2$ ambient.

9. A method according to claim 7 wherein said step of reflowing said first and second conductive layers comprises heating said first and second conductive layers to a temperature greater than approximately 750° C.

10. A method according to claim 1 wherein said step of forming said first conductive layer is preceded by the step of forming a diffusion barrier layer on said exposed portion of said source/drain region of said semiconductor substrate.

11. A method according to claim 10 wherein said diffusion barrier layer comprises a material chosen from the group consisting of a silicide, a nitride, TiSiN, and TiN.

12. A method according to claim 10 wherein said step of forming said diffusion barrier layer is preceded by the step of forming a layer of polycrystalline silicon or tungsten on said exposed portion of said source/drain region of said semiconductor substrate.

13. A method according to claim 1 wherein said steps of depositing said first and second conductive layers comprise depositing said first and second conductive layers on said exposed portion of said source/drain region and on said insulating layer, and further comprising the step of patterning said first and second conductive layers to define a conductive island on said insulating layer connected to said source/drain region through said contact hole.

14. A method according to claim 1 wherein said dielectric material comprises ferroelectric material chosen from the group consisting of BST, PZT, PLZT(Pb(La, Zn)TiO$_3$), and STO(SrTiO$_3$).

15. A method according to claim 1 wherein said step of forming said first conductive layer is preceded by the step of forming a layer of tungsten on said exposed portion of said source/drain region of said semiconductor substrate.

16. A method for forming a capacitor for a semiconductor device, said method comprising the steps of:

forming an insulating layer on a semiconductor substrate wherein said insulating layer has a contact hole therein exposing a portion of said substrate;

chemical vapor depositing a first conductive layer on said exposed portion of said substrate inside said contact hole, on sidewalls of said contact hole, and on a portion of said insulating layer adjacent said contact hole opposite said substrate;

physical vapor depositing a second conductive layer directly on said first conductive layer opposite said exposed portion of said substrate and on said first conductive layer opposite said portions of said insulating layer adjacent said contact hole;

forming a dielectric layer on said second conductive layer opposite said substrate; and forming a third conductive layer on said dielectric layer opposite said substrate.

17. A method for forming a capacitor for a semiconductor device, said method comprising the steps of:

forming an insulating layer on a semiconductor substrate wherein said insulating layer has a contact hole therein exposing a portion of said substrate;

chemical vapor depositing a first conductive layer on said exposed portion of said substrate;

physical vapor depositing a second conductive layer directly on said first conductive layer opposite said substrate with no intervening layers between said first and second conductive layers;

forming a dielectric layer on said second conductive layer opposite said substrate; and forming a third conductive layer on said dielectric layer opposite said substrate;

wherein each of said first and second conductive layers comprises a platinum group metal or an oxide thereof.

18. A method according to claim 17 wherein each of said first and second conductive layers comprises platinum.

19. A method according to claim 18 wherein said step of chemical vapor depositing said first conductive layer comprises depositing said first conductive layer by chemical vapor deposition in an Ar gas ambient including approximately 10% oxygen at a temperature in the range of 350° C. to 400° C. and at a pressure of approximately 1 torr.

20. A method according to claim 18 wherein said step of physical vapor depositing said second conductive layer comprises depositing said second conductive layer by physical vapor deposition in an Ar gas ambient at a temperature in the range of 20° C. to 400° C. and at a pressure in the range of 1 mtorr to 10 mtorr.

21. A method according to claim 17 wherein said platinum group metal includes a material chosen from the group consisting of Pt, Ru, Rh, Ir, and Os.

22. A method according to claim 16 further comprising the step of reflowing said first and second conductive layers.

23. A method according to claim 22 wherein said step of reflowing said first and second conductive layers is performed in an N$_2$ ambient.

24. A method according to claim 22 wherein said step of reflowing said first and second conductive layers comprises heating said first and second conductive layers to a temperature greater than approximately 750° C.

25. A method according to claim 16 wherein said step of forming said first conductive layer is preceded by the step of forming a diffusion barrier layer on said exposed portion of said semiconductor substrate.

26. A method according to claim 25 wherein said diffusion barrier layer comprises a material chosen from the group consisting of a suicide, a nitride, TiSiN, and TiN.

27. A method according to claim 25 wherein said step of forming said diffusion barrier layer is preceded by the step of forming a layer of polycrystalline silicon or tungsten on said exposed portion of said source/drain region of said semiconductor substrate.

28. A method according to claim 16 wherein said steps of depositing said first and second conductive layers comprise depositing said first and second conductive layers on said exposed portion of said substrate and on said insulating layer, and further comprising the step of patterning said first and second conductive layers to define a conductive island on said insulating layer connected to said substrate through said contact hole.

29. A method according to claim 16 wherein said dielectric material comprises ferroelectric material chosen from the group consisting of BST, PZT, PLZT(Pb(La, Zn)TiO$_3$), and STO(SrTiO$_3$).

30. A method according to claim 16 wherein said step of forming said first conductive layer is preceded by the step of forming a layer of tungsten on said exposed portion of said substrate.

31. A method for forming a contact metallization for a semiconductor device, said method comprising the steps of:

forming an insulating layer on a semiconductor substrate wherein said insulating layer has a contact hole therein exposing a portion of said substrate;

chemical vapor depositing a first conductive layer on said exposed portion of said substrate inside said contact hole, on sidewalls of said contact hole, and on a portion of said insulating layer adjacent said contact hole opposite said substrate; and physical vapor depositing a second conductive layer directly on said first conductive layer opposite said exposed portion of said substrate and on said first conductive layer opposite said portions of said insulating layer adjacent said contact hole.

32. A method for forming a contact metallization for a semiconductor device, said method comprising the steps of:

forming an insulating layer on a semiconductor substrate wherein said insulating layer has a contact hole therein exposing a portion of said substrate; p1 chemical vapor depositing a first conductive layer on said exposed portion of said substrate; and physical vapor depositing a second conductive layer directly on said first conductive layer opposite said substrate with no intervening layers between said first and second conductive layers;

wherein each of said first and second conductive layers comprises a platinum group metal or an oxide thereof.

33. A method according to claim 32 wherein each of said first and second conductive layers comprises platinum.

34. A method according to claim 33 wherein said step of chemical vapor depositing said first conductive layer comprises depositing said first conductive layer by chemical vapor deposition in an Ar gas ambient including approximately 10% oxygen at a temperature in the range of 350° C. to 400° C. and at a pressure of approximately 1 torr.

35. A method according to claim 33 wherein said step of physical vapor depositing said second conductive layer comprises depositing said second conductive layer by physical vapor deposition in an Ar gas ambient at a temperature in the range of 20° C. to 400° C. and at a pressure in the range of 1 mtorr to 10 mtorr.

36. A method according to claim 32 wherein said platinum group metal includes a material chosen from the group consisting of Pt, Ru, Rh, Ir, and Os.

37. A method according to claim 31 further comprising the step of reflowing said first and second conductive layers.

38. A method according to claim 37 wherein said step of reflowing said first and second conductive layers is performed in an $N_2$ ambient.

39. A method according to claim 37 wherein said step of reflowing said first and second conductive layers comprises heating said first and second conductive layers to a temperature greater than approximately 750° C.

40. A method according to claim 31 wherein said step of forming said first conductive layer is preceded by the step of forming a diffusion barrier layer on said exposed portion of said semiconductor substrate.

41. A method according to claim 40 wherein said diffusion barrier layer comprises a material chosen from the group consisting of a silicide, a nitride, TiSiN, and TiN.

42. A method according to claim 40 wherein said step of forming said diffusion barrier layer is preceded by the step of forming a layer of polycrystalline silicon or tungsten on said exposed portion of said semiconductor substrate.

43. A method according to claim 31 wherein said steps of depositing said first and second conductive layers comprise depositing said first and second conductive layers on said exposed portion of said substrate and on said insulating layer, and further comprising the step of patterning said first and second conductive layers to define a conductive island on said insulating layer connected to said substrate through said contact hole.

44. A method according to claim 31 further comprising the steps of:

forming a dielectric layer on said second conductive layer opposite said substrate; and forming a third conductive layer on said dielectric layer opposite said substrate.

45. A method according to claim 44 wherein said dielectric material comprises a ferroelectric material chosen from the group consisting of BST, PZT, PLZT(Pb(La, Zn)$TiO_3$), and STO(SrTiO$_3$).

46. A method according to claim 31 wherein said step of forming said first conductive layer is preceded by the step of forming a layer of tungsten on said exposed portion of said substrate.

47. A method according to claim 2 wherein said first conductive layer and said second conductive layer comprise a common material.

48. A method according to claim 17 wherein said first conductive layer and said second conductive layer comprise a common material.

49. A method according to claim 32 wherein said first conductive layer and said second conductive layer comprise a common material.

* * * * *

UNITED STATES PATENT AND TRADEMARK OFFICE
CERTIFICATE OF CORRECTION

PATENT NO. : 5,918,118
DATED : June 29, 1999
INVENTOR(S) : Kim et al.

It is certified that error appears in the above-identified patent and that said Letters Patent is hereby corrected as shown below:

In the Claims:
Claim 5, Column 8, line 54 should read:
" 5. A method according to claim 3 wherein said step of"

Claim 26, Column 10, line 34 should read:
"consisting of a silicide, a nitride, TiSiN, and TiN."

Claim 32, Column 11, lines 8-10 should read:
"exposing a portion of said substrate;
chemical vapor depositing a first conductive layer on said exposed portion of said substrate; and"

Signed and Sealed this

First Day of February, 2000

Attest:

Q. TODD DICKINSON

*Attesting Officer*            *Acting Commissioner of Patents and Trademarks*